United States Patent
Li et al.

(10) Patent No.: US 10,832,872 B2
(45) Date of Patent: Nov. 10, 2020

(54) METHOD FOR PREPARING POLYANILINE/RUTHENIUM OXIDE/TIN DIOXIDE COMPOSITE ELECTRODE MATERIAL

(71) Applicant: Guizhou Institute of Technology, Guiyang (CN)

(72) Inventors: Xiang Li, Guiyang (CN); Yongmei Luo, Guiyang (CN); Fanghai Lu, Guiyang (CN); Yingfen Li, Guiyang (CN)

(73) Assignee: GUIZHOU INSTITUTE OF TECHNOLOGY, Guiyang (CN)

( * ) Notice: Subject to any disclaimer, the term of this patent is extended or adjusted under 35 U.S.C. 154(b) by 80 days.

(21) Appl. No.: 16/203,359

(22) Filed: Nov. 28, 2018

(65) Prior Publication Data
US 2020/0051756 A1 Feb. 13, 2020

(30) Foreign Application Priority Data
Aug. 13, 2018 (CN) .......................... 2018 1 0915013

(51) Int. Cl.
| | |
|---|---|
| *C23C 28/00* | (2006.01) |
| *H01G 11/46* | (2013.01) |
| *C23C 14/08* | (2006.01) |
| *C23C 14/35* | (2006.01) |
| *C23C 22/82* | (2006.01) |
| *C25B 11/04* | (2006.01) |
| *C25D 9/02* | (2006.01) |
| *H01G 11/24* | (2013.01) |

(Continued)

(52) U.S. Cl.
CPC .......... *H01G 11/46* (2013.01); *C23C 14/086* (2013.01); *C23C 14/35* (2013.01); *C23C 22/82* (2013.01); *C25B 11/0489* (2013.01); *C25D 9/02* (2013.01); *H01G 11/24* (2013.01); *H01G 11/26* (2013.01); *H01G 11/32* (2013.01); *H01G 11/48* (2013.01); *C08G 73/0266* (2013.01)

(58) Field of Classification Search
CPC ..................................................... C23C 28/00
USPC ......................................................... 205/188
See application file for complete search history.

(56) References Cited

PUBLICATIONS

Deshmukh et al., Inexpensive Synthesis Route of Porous Polyaniline-Ruthenium Oxide Composite for Supercapacitor Application, Chemical Engineering Journal (2014), vol. 257, pp. 82-89. (Year: 2014).*

(Continued)

*Primary Examiner* — Edna Wong
(74) *Attorney, Agent, or Firm* — Mintz Levin Cohn Ferris Glovsky and Popeo, P.C.

(57) ABSTRACT

The present invention provides a method for preparing a polyaniline/$RuO_2$/$SnO_2$ composite electrode material, including: sputtering a $SnO_2$ film onto a tantalum substrate by a magnetron sputtering method, to form a $SnO_2$ layer; preparing porous-structured $RuO_2$ nanoparticles with a uniform pore size distribution (10-15 nm) by a template method; and embedding polyaniline into the $RuO_2$ nanoparticle matrix by a electrodeposition method, to finally obtain a multilayer-structured polyaniline/$RuO_2$/$SnO_2$ composite electrode material with a specific capacitance value of 680-702 F·g−1 and an excellent cycling charge-discharge performance after it is assembled into an electrochemical capacitor.

11 Claims, 1 Drawing Sheet

(51) Int. Cl.
*H01G 11/26* (2013.01)
*H01G 11/32* (2013.01)
*H01G 11/48* (2013.01)
C08G 73/02 (2006.01)

(56) References Cited

PUBLICATIONS

Kuo et al., "Composite Supercapacitor Containing Tin Oxide and Electroplated Ruthenium Oxide," Electrochemical and Solid-State Letters (2003), vol. 6, No. 5, pp. A85-A87. (Year: 2003).*

Wang et al., "Pseudo-Capacitance of Ruthenium Oxide/Carbon Black Composites for Electrochemical Capacitors," Journal of University of Science and Technology Beijing, Mineral, Metallurgy, Material (2008), vol. 15, No. 6, pp. 816-821. (Year: 2008).*

* cited by examiner

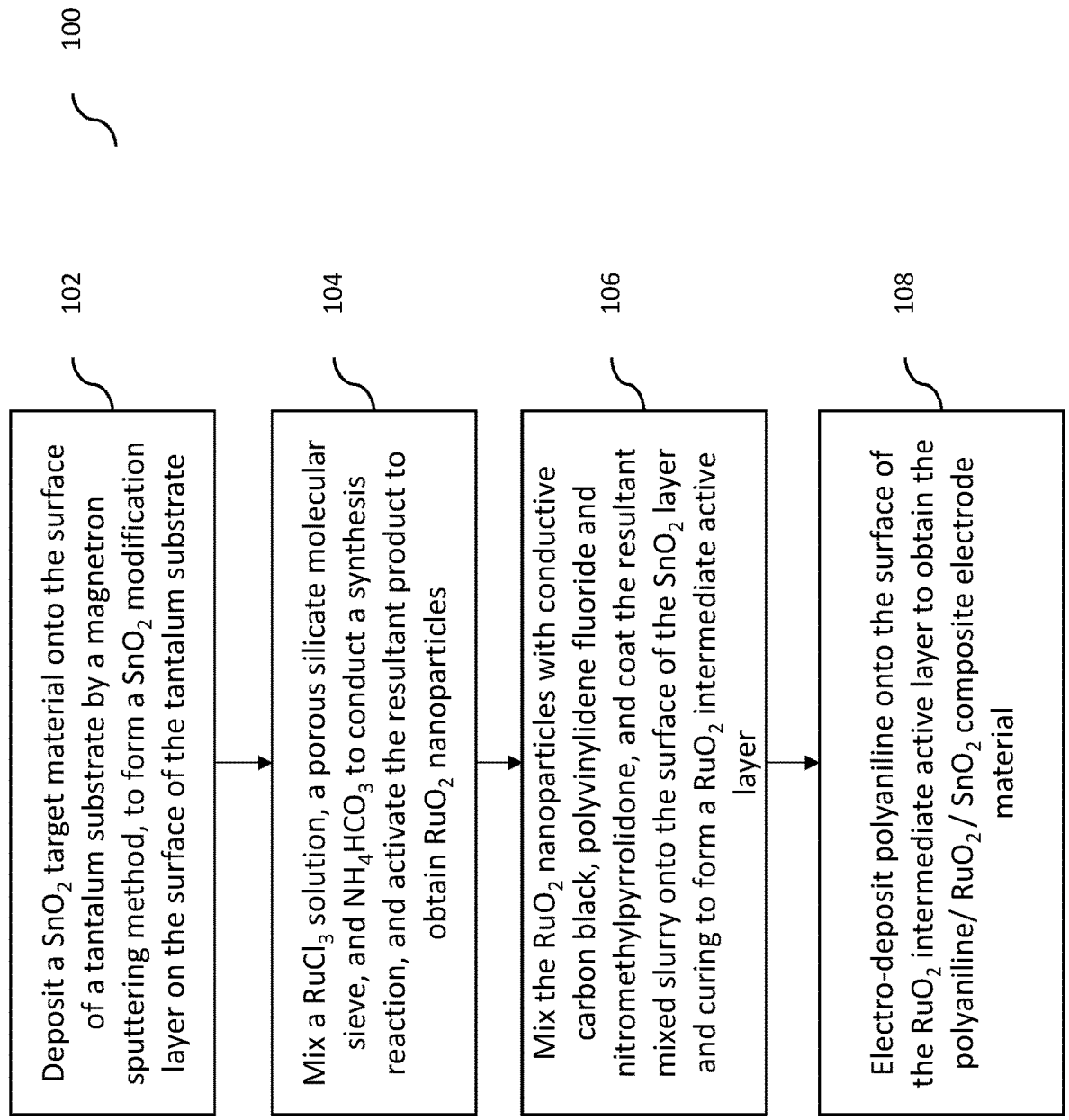

METHOD FOR PREPARING POLYANILINE/RUTHENIUM OXIDE/TIN DIOXIDE COMPOSITE ELECTRODE MATERIAL

CROSS-REFERENCE TO RELATED APPLICATIONS

This application claims priority to Chinese Patent Appl. No. 201810915013.X, filed Aug. 13, 2018, and entitled "Method For Preparing Polyaniline/Ruthenium Oxide/Tin Dioxide Composite Electrode Material", and incorporates its disclosure herein by reference in its entirety.

TECHNICAL FIELD

The present invention relates to the technical field of electrochemical capacitors, and more particularly to a method for preparing a polyaniline/$RuO_2$/$SnO_2$ composite electrode material.

BACKGROUND

A highly reversible Faradaic pseudocapacitance behavior is conducted between an electrode material constituting an electrochemical capacitor and an electrolytic solution to store charges, where the electrode material is a key component of an energy storage device.

Compared with other types of energy storage devices, the electrochemical capacitor formed from a $RuO_2$ electrode material has a high specific capacitance value and excellent power density, and is used as an auxiliary power supply in related fields of national defense, military, aerospace, and the like. However, when the electrochemical capacitor of this type is subjected to circulating charge and discharge, the electrode substrate often precipitates bubbles to impact an electrode active layer and thus causes falling off of the electrode active layer, accelerating the failure of the energy storage device. Furthermore, the $RuO_2$ electrode material is a rare material, which limits its large-scaled application.

Compared with a carbon material (activated carbon, a carbon nanotube and a carbon fiber) and most transition metal oxides ($RuO_2$, $NiO_2$, $MO_2$, and $Co_3O_4$, etc.), the conductive polymer polyaniline has become a potential electrode material due to its high specific capacitance and low cost. However, there are two technical disadvantages when an electrode material is prepared from merely polyaniline: on one hand, the charge-discharge rate is low; and on the other hand, the cycling number of the electrode material of merely polyaniline is lower as compared with the carbon material and the most transition metal oxides.

Therefore, how to ensure that the electrode material has a high specific capacitance value and excellent cycling stability while reducing the cost is now an urgent technical problem to be solved.

SUMMARY

The objective of the present invention is to provide a method for preparing a polyaniline/$RuO_2$/$SnO_2$ composite electrode material. The composite electrode material has a high specific capacitance value and excellent cycling stability, as well as a low cost.

To achieve the above objective, the present invention provides the following technical solution:

The present invention provides a method for preparing a polyaniline/$RuO_2$/$SnO_2$ composite electrode material, including the following steps:

depositing a $SnO_2$ target material onto the surface of a tantalum substrate by a magnetron sputtering method, to form a $SnO_2$ modification layer on the surface of the tantalum substrate;

mixing a $RuCl_3$ solution, a porous silicate molecular sieve, and $NH_4HCO_3$ to conduct a synthesis reaction, and activating the resultant product to obtain $RuO_2$ nanoparticles;

mixing the $RuO_2$ nanoparticles with conductive carbon black, polyvinylidene fluoride and nitromethylpyrrolidone, and coating the resultant mixed slurry onto the surface of the $SnO_2$ layer and curing to form a $RuO_2$ intermediate active layer; and electro-depositing polyaniline onto the surface of the $RuO_2$ intermediate active layer to obtain the polyaniline/$RuO_2$/$SnO_2$ composite electrode material.

Preferably, the thickness of the $SnO_2$ layer is 0.5-0.6 μm.

Preferably, the tantalum substrate is a high-purity tantalum foil with a tantalum content of 99.95%.

Preferably, the magnetron sputtering method is conducted at a pressure of 3-5 Pa, a current of 20-25 mA, and a voltage of 20-25 V, for a time period of 35-45 min.

Preferably, the synthesis reaction is conducted at a temperature of 240-260° C. for a time period of 5-6 h.

Preferably, the activator employed for the activation is a KOH solution with a mass concentration of 1 mol/L.

Preferably, the activation is conducted at a temperature of 90-110° C. for a time period of 24-30 h.

Preferably, the mass percentage of the $RuO_2$ nanoparticles to the conductive carbon black and the polyvinylidene fluoride is 44:3:3.

Preferably, the thickness of the $RuO_2$ layer is 5-6 μm.

Preferably, the current density of the electrodeposition is 2.5-3.5 mA·cm$^{-2}$.

The present invention provides a method for preparing a polyaniline/$RuO_2$/$SnO_2$ composite electrode material. In the present invention, a $SnO_2$ film is sputtered onto a tantalum substrate by adopting a magnetron sputtering method to form a dense $SnO_2$ film modification layer, which can prevent acceleration of failure of an electrochemical capacitor device due to deformation and falling off of an electrode active layer caused by the hydrogen evolution reaction of the tantalum electrode substrate during the pseudocapacitance behavior of the electrode material; and $SnO_2$ has a high specific capacitance value and a low cost.

In the present invention, by preparing $RuO_2$ nanoparticles by a template method, porous-structured $RuO_2$ nanoparticles with a uniform pore size distribution (10-15 nm) can be obtained, increasing the specific surface area and increasing the specific capacitance value of the electrode material.

In the present invention, polyaniline is embedded onto the surface of the $RuO_2$ nanoparticles and into the interior of the pore structure thereof through an electrodeposition method. By incorporating polyaniline into the porous-structured $RuO_2$ nanoparticles, it facilitates improvement of electrode stability, a $RuO_2$-based composite electrode material with a large cycling number can be obtained, and the cost of the electrode material is reduced.

In the present invention, the multilayer-structured polyaniline/$RuO_2$/$SnO_2$ composite electrode material prepared by the compound process of magnetron sputtering-template method-electrodeposition method has a specific capacitance value up to 702 F·g$^{-1}$, has a capacitance remained at 84.6% after it is assembled into the electrochemical capacitor and subjected to 10,000 cycles, and thus the composite electrode material has an excellent cycling charge-discharge performance.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings, FIG. 1 illustrates an exemplary process, according to some implementations of the current subject matter.

DETAILED DESCRIPTION

As shown in FIG. 1, the present invention provides a method 100 for preparing a polyaniline/$RuO_2$/$SnO_2$ composite electrode material, including the following steps:
  depositing a $SnO_2$ target material onto the surface of a tantalum substrate by a magnetron sputtering method, to form a $SnO_2$ modification layer on the surface of the tantalum substrate, at 102;
  mixing a $RuCl_3$ solution, a porous silicate molecular sieve, and $NH_4HCO_3$ to conduct a synthesis reaction, and activating the resultant product to obtain $RuO_2$ nanoparticles, at 104;
  mixing the $RuO_2$ nanoparticles with conductive carbon black, polyvinylidene fluoride and nitromethylpyrrolidone, and coating the resultant mixed slurry onto the surface of the $SnO_2$ layer and curing to form a $RuO_2$ intermediate active layer, at 106; and
  electro-depositing polyaniline onto the surface of the $RuO_2$ intermediate active layer to obtain the polyaniline/$RuO_2$/$SnO_2$ composite electrode material, at 108.

In the present invention, the $SnO_2$ target material is deposited onto the surface of the tantalum substrate by the magnetron sputtering method, so as to form the $SnO_2$ modification layer on the surface of the tantalum substrate. In the present invention, the tantalum substrate is preferably a high-purity tantalum foil (with a tantalum content of 99.95%), which is preferably circular shaped and has a diameter preferably of 4-100 mm. In the present invention, before performing the deposition, preferably the tantalum substrate is sequentially subjected to a polishing process and a degreasing process; specifically, the polishing process is preferably polishing the tantalum substrate with a metallographical sand paper having a particle size of 500-800 mesh until the oxidation layer on the surface layer of the tantalum substrate is completely removed; specifically, the degreasing process is preferably placing the polished tantalum substrate into an ultrasonic washer, and performing the degreasing process respectively with acetone and a mixed alkali solution for 3 to 5 min; and the ingredients of the mixed alkali solution are preferably 5 g·$L^{-1}$ NaOH, 10 g·$L^{-1}$ $Na_2CO_3$, 20 g·$L^{-1}$ $Na_3PO_4$ and 15 g·$L^{-1}$ $Na_2SiO_3$. In the present invention, after the degreasing process is completed, preferably an atmospheric plasma washing machine is used to wash the surface of the degreased tantalum substrate; during the wash, the distance between the tantalum substrate and the plasma flame nozzle is preferably 2-3 cm; and the washing time is preferably 4-6 min, and more preferably 5 min.

In the present invention, the process of the magnetron sputtering method is preferably mounting the pre-processed tantalum substrate and the $SnO_2$ target material respectively into respective fixtures in a magnetron sputtering chamber, evacuating to 0.5-0.7×$10^{-3}$ Pa, introducing nitrogen to make the pressure of the sputtering chamber be 3-5 Pa, then activating a sputtering system and making the current be 20-25 mA and the voltage be 20-25 V, and then conducting sputtering for 35-45 min to form a dense $SnO_2$ layer on the tantalum substrate. In the present invention, the purity of the $SnO_2$ target material is preferably more than 99.5%; and the thickness of the $SnO_2$ layer is preferably 0.5-0.6 μm.

In the present invention, the $RuCl_3$ solution, the porous silicate molecular sieve, and $NH_4HCO_3$ are mixed to conduct the synthesis reaction, and the resultant product is activated to obtain the $RuO_2$ nanoparticles. In the present invention, preferably $RuCl_3$·$xH_2O$ is dissolved in deionized water to obtain a $RuCl_3$ solution, where the mass concentration of the $RuCl_3$ solution is preferably 1%, and the mass ratio of $RuCl_3$·$xH_2O$ to $NH_4HCO_3$ is preferably 3:5. In the present invention, mixing is preferably conducted by stirring, and the mixing time is preferably 2-3 h. In the present invention, the synthesis reaction is conducted at a temperature preferably of 240-260° C. for a time period preferably of 5-6 h. In the present invention, the activator employed for the activation is preferably a KOH solution with a concentration preferably of 1 mol/L; the activation temperature is preferably 95-105° C., and more preferably 100° C.; and the activation time is preferably 24-30 h, and more preferably 25-28 h.

In the present invention, after completion of the activation, preferably the resultant activated product is dried to obtain the $RuO_2$ nanoparticles. The present invention has no particular requirement on the manner of drying, and drying can be carried out in a manner well known to those skilled in the art.

In the present invention, the preparation method of the porous silicate molecular sieve is preferably: mixing 5 g polyethylene oxide-polypropylene oxide-polyethylene oxide triblock copolymer (P123) with deionized water (180 mL) and hydrochloric acid (9 mL, with a concentration of 34-36 wt. %); adding isopropanol (6 g) and stirring for 1 h when the resultant mixture is heated to 35° C.; followed by adding ethyl orthosilicate (10.5 g) into the resultant mixed system and then stirring for 24 h; subsequently conducting hydrothermal treatment at 100° C. for 24 h; filtering and drying the resultant product; and then washing the dried product with a mixed solution of ethanol and hydrochloric acid (the mass concentration of ethanol is 3 mol/L, and the mass concentration of hydrochloric acid is 0.5 mol/L) to obtain a porous silicate molecular sieve of 15-20 nm. In the present invention, by utilizing the porous silicate molecular sieve as the template, the porous-structured $RuO_2$ nanoparticles having a uniform pore size distribution can be obtained.

In the present invention, after the $RuO_2$ nanoparticles are obtained, the $RuO_2$ nanoparticles are mixed with conductive carbon black, polyvinylidene fluoride and nitromethylpyrrolidone, and the resultant mixed slurry is coated on the surface of the $SnO_2$ layer and cured to form the $RuO_2$ intermediate active layer. In the present invention, the mass percentage of the $RuO_2$ nanoparticles to the conductive carbon black and the polyvinylidene fluoride is preferably 88%:6%:6%. In the present invention, the ratio of the total mass of the $RuO_2$ nanoparticles, the conductive carbon black and the polyvinylidene fluoride to the volume of the nitropotassiumpyrrolidone is preferably 0.3 g:2-3 mL. The present invention has no particular requirement on the manner of coating, and coating can be carried out in a manner well known to those skilled in the art. In the present invention, the curing temperature is preferably 80-100° C.; the curing time is preferably 10-24 h; and in the present invention, the curing is preferably vacuum drying under the condition of 80-100° C. for 10-24 h. In the present invention, the thickness of the $RuO_2$ layer is preferably 5-6 μm.

In the present invention, after the $RuO_2$ intermediate active layer is obtained, polyaniline is electro-deposited onto the surface of the $RuO_2$ intermediate active layer to obtain the polyaniline/$RuO_2$/$SnO_2$ composite electrode material. In the present invention, the electrolytic solution for the electrodeposition is preferably a mixed solution of aniline and $H_2SO_4$, and in the electrolytic solution, the mass concentration of aniline is preferably 0.1 mol·$L^{-1}$; and the mass concentration of $H_2SO_4$ is preferably 0.5 mol·$L^{-1}$. In the present invention, the current density of the electrodeposition is preferably 2.5-3.5 mA·$cm^{-2}$, and more preferably 3.0 mA·$cm^{-1}$. In the present invention, after the electrodeposition is completed, the resultant product is naturally dried to obtain the polyaniline/$RuO_2$/$SnO_2$ composite electrode material.

The polyaniline/$RuO_2$/$SnO_2$ composite electrode material as provided by the present invention will be described in detail below in connection with Embodiments, but these Embodiments should not be understood as limiting the claimed scope of the present invention.

Embodiment 1

A high-purity tantalum foil was selected and then wire cut to a diameter of 50 mm; the tantalum substrate was polished with a metallographical sand paper having a particle size of 500 mesh until the oxidation layer on the surface layer of the tantalum substrate was completely removed; the polished tantalum substrate was placed into an ultrasonic washer, and degreased respectively with acetone and a mixed alkali solution (ingredients: 5 g·$L^{-1}$ NaOH, 10 g·$L^{-1}$ $Na_2CO_3$, 20 g·$L^{-1}$ $Na_3PO_4$ and 15 g·$L^{-1}$ $Na_2SiO_3$) for 5 min; and then an atmospheric plasma washing agent was used to conduct ultra-clean washing on the surface of the degreased tantalum substrate, where the distance between the tantalum substrate and the plasma flame nozzle was maintained at 3 cm, and the washing time was 5 min.

The processed tantalum substrate and the $SnO_2$ sputtering target material were respectively mounted into respective fixtures in a magnetron sputtering chamber, the chamber was evacuated to 0.5×$10^{-3}$ Pa, then a $N_2$ gas was introduced into the chamber to make the pressure of the sputtering chamber be 5 Pa, then a sputtering system was activated, the current was maintained at 25 mA and the voltage was maintained at 25 V, and the sputtering was conducted for 40 min to form a $SnO_2$ layer on the tantalum substrate.

5 g of the copolymer P123 was dissolved in 180 mL deionized water and 9 mL hydrochloric acid (with a concentration of 34-36 wt. %), added with 6 g isopropanol and stirred for 1 h upon heated to 35° C., followed by addition of 10.5 g ethyl orthosilicate, and stirred for 24 h, and then subjected to hydrothermal treatment at 100° C. for 24 h, the resultant product was filtered and dried, and the resultant dried product was washed with a mixed solution of ethanol and hydrochloric acid (the mass concentration of ethanol is 3 mol/L, and the mass concentration of hydrochloric acid is 0.5 mol/L) to obtain a porous silicate molecular sieve.

3 g $RuCl_3·xH_2O$ was dissolved in 297 mL deionized water and used to impregnate the porous silicate molecular sieve, then added with 5 g $NH_4HCO_3$ and stirred for 3 h, subsequently heated to 240° C. and maintained at this temperature for about 5 h, then placed into a KOH solution having a concentration of 1 mol $L^{-1}$ at 100° C. and heated for 24 h, and dried to obtain the $RuO_2$ nanoparticles.

0.3 g of the mixture (88 wt. % of the $RuO_2$ nanoparticles, 6 wt. % of conductive carbon black, and 6 wt. % of polyvinylidene fluoride) was ground into a slurry together with 2 mL nitromethylpyrrolidone, and then knife-coated onto the surface of the $SnO_2$ layer to form a wet film with a thickness of 5 μm, and finally cured by vacuum-drying at 90° C. for 10 h to form a $RuO_2$ layer on the surface of the $SnO_2$ layer.

A mixed solution of aniline and $H_2SO_4$ (the mass concentration of aniline was 0.1·mol·$L^{-1}$; and the mass concentration of $H_2SO_4$ was 0.5 mol·$L^{-1}$) was used as the electrolytic solution, and the above-mentioned tantalum substrate coated with the $RuO_2$ layer was placed into the electrolytic solution for electrochemical deposition with a current density of 3 mA·$cm^{-2}$, and the deposited product was naturally dried to obtain the polyaniline/$RuO_2$/$SnO_2$ composite electrode material.

A performance measurement was conducted for the polyaniline/$RuO_2$/$SnO_2$ composite electrode material prepared in this embodiment, where the composite electrode material had a specific capacitance value of 702 F·$g^{-1}$, and had an excellent cycling charge-discharge performance after it was assembled into the electrochemical capacitor.

Embodiment 2

A high-purity tantalum foil was selected and then wire cut to a diameter of 70 mm; the tantalum substrate was polished with a metallographical sand paper having a particle size of 600 mesh until the oxidation layer on the surface layer of the tantalum substrate was completely removed; the polished tantalum substrate was placed into an ultrasonic washer, and degreased respectively with acetone and a mixed alkali solution (ingredients: 5 g·$L^{-1}$ NaOH, 10 g·$L^{-1}$ $Na_2CO_3$, 20 g·$L^{-1}$ $Na_3PO_4$ and 15 g·$L^{-1}$ $Na_2SiO_3$) for 5 min; and then an atmospheric plasma washing agent was used to conduct ultra-clean washing on the surface of the degreased tantalum substrate, where the distance between the tantalum substrate and the plasma flame nozzle was maintained at 3 cm, and the washing time was 5 min.

The processed tantalum substrate and the $SnO_2$ sputtering target material were respectively mounted into respective fixtures in a magnetron sputtering chamber, the chamber was evacuated to 0.5×$10^{-3}$ Pa, then a $N_2$ gas was introduced into the chamber to make the pressure of the sputtering chamber be 5 Pa, then a sputtering system was activated, the current was maintained at 25 mA and the voltage was maintained at 25 V, and the sputtering was conducted for 40 min to form a $SnO_2$ layer on the tantalum substrate.

5 g of the copolymer P123 was dissolved in 180 mL deionized water and 9 mL hydrochloric acid (with a concentration of 34-36 wt. %), added with 6 g isopropanol and stirred for 1 h upon heated to 35° C., followed by addition of 10.5 g ethyl orthosilicate, and stirred for 24 h, and then subjected to hydrothermal treatment at 100° C. for 24 h, the resultant product was filtered and dried, and the resultant dried product was washed with a mixed solution of ethanol and hydrochloric acid (the mass concentration of ethanol is 3 mol $L^{-1}$, and the mass concentration of hydrochloric acid is 0.5 mol/L) to obtain a porous silicate molecular sieve.

3 g $RuCl_3·xH_2O$ was dissolved in 297 mL deionized water and used to impregnate the porous silicate molecular sieve, then added dropwise with 5 g $NH_4HCO_3$ and stirred for 3 h, subsequently heated to 250° C. and maintained at this temperature for about 6 h, then placed into a KOH solution having a concentration of 1 mol L$^{-1}$ at 100° C. and heated for 30 h, and dried to obtain the RuO$_2$ nanoparticles.

0.3 g of the mixture (88 wt. % of the RuO$_2$ nanoparticles, 6 wt. % of conductive carbon black, and 6 wt. % of polyvinylidene fluoride) was ground into a slurry together with 3 mL nitromethylpyrrolidone, and then knife-coated onto the surface of the SnO$_2$ layer to form a wet film with a thickness of 6 μm, and finally cured by vacuum-drying at 100° C. for 12 h to form a RuO$_2$ layer on the surface of the SnO$_2$ layer.

A mixed solution of aniline and H$_2$SO$_4$ (the mass concentration of aniline was 0.1·mol·L$^{-1}$; and the concentration of H$_2$SO$_4$ was 0.5 mol·L$^{-1}$) was used as the electrolytic solution, and the above-mentioned tantalum substrate coated with the RuO$_2$ layer was placed into the electrolytic solution for electrochemical deposition with a current density of 3 mA·cm$^{-2}$, and the deposited product was naturally dried to obtain the polyaniline/RuO$_2$/SnO$_2$ composite electrode material.

A performance measurement was conducted for the polyaniline/RuO$_2$/SnO$_2$ composite electrode material prepared in this embodiment, where the composite electrode material had a specific capacitance value of 685 F·g$^{-1}$, and had an excellent cycling charge-discharge performance after it was assembled into the electrochemical capacitor.

Embodiment 3

A high-purity tantalum foil was selected and then wire cut to a diameter of 80 mm; the tantalum substrate was polished with a metallographical sand paper having a particle size of 800 mesh until the oxidation layer on the surface layer of the tantalum substrate was completely removed; the polished tantalum substrate was placed into an ultrasonic washer, and degreased respectively with acetone and a mixed alkali solution (ingredients: 5 g·L$^{-1}$ NaOH, 10 g·L$^{-1}$ Na$_2$CO$_3$, 20 g·L$^{-1}$ Na$_3$PO$_4$ and 15 g·L$^{-1}$ Na$_2$SiO$_3$) for 5 min; and then an atmospheric plasma washing agent was used to conduct ultra-clean washing on the surface of the degreased tantalum substrate, where the distance between the tantalum substrate and the plasma flame nozzle was maintained at 3 cm, and the washing time was 5 min.

The processed tantalum substrate and the SnO$_2$ sputtering target material were respectively mounted into respective fixtures in a magnetron sputtering chamber, the chamber was evacuated to 0.5×10$^{-3}$ Pa, then a N$_2$ gas was introduced into the chamber to make the pressure of the sputtering chamber be 5 Pa, then a sputtering system was activated, the current was maintained at 25 mA and the voltage was maintained at 25 V, and the sputtering was conducted for 40 min to form a dense SnO$_2$ film layer on the tantalum substrate.

5 g of the copolymer P123 was dissolved in 180 mL deionized water and 9 mL hydrochloric acid (with a concentration of 34-36 wt. %), added with 6 g isopropanol and stirred for 1 h upon heated to 35° C., followed by addition of 10.5 g ethyl orthosilicate, and stirred for 24 h, and then subjected to hydrothermal treatment at 100° C. for 24 h, the resultant product was filtered and dried, and the resultant dried product was washed with a mixed solution of ethanol and hydrochloric acid (the concentration of ethanol is 3 mol L$^{-1}$, and the mass concentration of hydrochloric acid is 0.5 mol L$^{-1}$) to obtain a porous silicate molecular sieve.

3 g RuCl$_3$.xH$_2$O was dissolved in 297 mL deionized water and used to impregnate the porous silicate molecular sieve, then added dropwise with 5 g NH$_4$HCO$_3$ and stirred for 3 h, subsequently heated to 260° C. and maintained at this temperature for about 5.5 h, then placed into a KOH solution having a concentration of 1 mol L$^{-1}$ at 100° C. and heated for 36 h, and dried to obtain the RuO$_2$ nanoparticles.

0.3 g of the mixture (88 wt. % of the RuO$_2$ nanoparticles, 6 wt. % of conductive carbon black, and 6 wt. % of polyvinylidene fluoride) was ground into a slurry together with 2.5 mL nitromethylpyrrolidone, and then knife-coated onto the surface of the SnO$_2$ layer to form a wet film with a thickness of 6 μm, and finally cured by vacuum-drying at 100° C. for 14 h to form a RuO$_2$ layer on the surface of the SnO$_2$ layer.

A mixed solution of aniline and H$_2$SO$_4$ (the mass concentration of aniline was 0.1·mol·L$^{-1}$; and the mass concentration of H$_2$SO$_4$ was 0.5 mol·L$^{-1}$) was used as the electrolytic solution, and the above-mentioned tantalum substrate coated with the RuO$_2$ layer was placed into the electrolytic solution for electrochemical deposition with a current density of 3 mA·cm$^{-2}$, and the deposited product was naturally dried to obtain the polyaniline/RuO$_2$/SnO$_2$ composite electrode material.

A performance measurement was conducted for the polyaniline/RuO$_2$/SnO$_2$ composite electrode material prepared in this embodiment, where the composite electrode material had a specific capacitance value of 694 F·g$^{-1}$, and had an excellent cycling charge-discharge performance after it was assembled into the electrochemical capacitor.

The polyaniline/RuO$_2$/SnO$_2$ composite electrode materials prepared in Embodiments 1-3 of the present invention were compared with the electrode materials prepared by other existing processes in performance, and the specific data was shown in Table 1.

TABLE 1

Comprehensive technological index of RuO$_2$-based electrode material for supercapacitor.

| Type of Electrode Materials | Preparation Process | Specific Capacitance (F g$^{-1}$) | Cycling Number | Hydrogen Evolution | Cost |
|---|---|---|---|---|---|
| Activated carbon/RuO$_2$ | Sol-gel method | 400-580 | 8000-12000 | Yes | Relatively high |
| SnO$_2$/RuO$_2$ | electrodeposition | 450-600 | 6000-10000 | Yes | High |
| polyaniline/RuO$_2$ | Sol-gel method + chemical method | 480-620 | 6000-10000 | Yes | Relatively high |
| polyaniline/RuO$_2$/SnO$_2$ | Process provided by the present invention | 680-702 | 12000-15000 | Relatively small | Medium |

It can be seen from Table 1 that, the polyaniline/RuO$_2$/SnO$_2$ composite electrode material prepared by magnetron sputtering-template method-electrodeposition method of the present invention has a high specific capacitance value, an excellent cycling performance, and a low cost, as compared with the electrode materials prepared by existing processes.

It can be seen from the aforementioned embodiments that, the present invention provides a method for preparing a polyaniline/$RuO_2$/$SnO_2$ composite electrode material, where the multilayer-structured polyaniline/$RuO_2$/$SnO_2$ composite electrode material prepared by magnetron sputtering-template method-electrodeposition method has a specific capacitance value up to 680-702 $F \cdot g^{-1}$, and has an excellent cycling charge-discharge performance after it is assembled into the electrochemical capacitor.

The foregoing descriptions are only preferred implementation manners of the present invention. It should be noted that for a person of ordinary skill in the art, several improvements and modifications may further be made without departing from the principle of the present invention. These improvements and modifications should also be deemed as falling within the protection scope of the present invention.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input (e.g., push/touch button, etc.). Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few implementations have been described in detail above, other modifications or additions are possible. In particular, further features and/or implementations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A method for preparing a polyaniline/$RuO_2$/$SnO_2$ composite electrode material, comprising the following steps:
   depositing a $SnO_2$ target material onto a surface of a tantalum substrate by a magnetron sputtering method, to form a $SnO_2$ layer on the surface of the tantalum substrate;
   mixing a $RuCl_3$ solution, a porous silicate molecular sieve, and $NH_4HCO_3$ to conduct a synthesis reaction, and activating a resultant product to obtain $RuO_2$ nanoparticles;
   mixing the $RuO_2$ nanoparticles with conductive carbon black, polyvinylidene fluoride and nitromethylpyrrolidone, and coating a resultant mixed slurry onto a surface of the $SnO_2$ layer and curing to form a $RuO_2$ intermediate active layer; and
   electro-depositing polyaniline onto a surface of the $RuO_2$ intermediate active layer to obtain the polyaniline/$RuO_2$/$SnO_2$ composite electrode material.

2. The method for preparing of claim 1, wherein a thickness of the $SnO_2$ layer is 0.5-0.6 μm.

3. The method for preparing of claim 1, wherein the tantalum substrate is a high-purity tantalum foil with a tantalum content of 99.95%.

4. The method for preparing of claim 1, wherein the magnetron sputtering method is conducted at a pressure of 3-5 Pa, a current of 20-25 mA, and a voltage of 20-25 V, for a time period of 35-45 min.

5. The method for preparing of claim 1, wherein the synthesis reaction is conducted at a temperature of 240-260° C. for a time period of 5-6 h.

6. The method for preparing of claim 1, wherein an activator employed for the activating is a KOH solution with a mass concentration of 1 mol $L^{-1}$.

7. The method for preparing of claim 6, wherein the activation activating is conducted at a temperature of 90-110° C. for a time period of 24-30 h.

8. The method for preparing of claim 1, wherein the activation activating is conducted at a temperature of 90-110° C. for a time period of 24-30 h.

9. The method for preparing of claim 1, wherein a mass percentage of the $RuO_2$ nanoparticles to the conductive carbon black and the polyvinylidene fluoride is 88%:6%:6%.

10. The method for preparing of claim 1, wherein a thickness of the $RuO_2$ intermediate active layer is 5-6 μm.

11. The method for preparing of claim 1, wherein a current density of the electrodeposition is 2.5-3.5 $mA \cdot cm^{-2}$.

* * * * *

UNITED STATES PATENT AND TRADEMARK OFFICE
CERTIFICATE OF CORRECTION

PATENT NO. : 10,832,872 B2
APPLICATION NO. : 16/203359
DATED : November 10, 2020
INVENTOR(S) : Xiang Li et al.

Page 1 of 1

It is certified that error appears in the above-identified patent and that said Letters Patent is hereby corrected as shown below:

In the Claims

At Column 10, Line 48, replace "6" with --1-- between "claim" and ", wherein".

At Column 10, Line 49, delete "activation" before "activating".

At Column 10, Line 51, replace "1" with --6-- between "claim" and ", wherein".

At Column 10, Line 52, delete "activation" before "activating".

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*